United States Patent [19]
Templeton et al.

[11] 3,951,695
[45] Apr. 20, 1976

[54] AUTOMATIC END STATION FOR ION IMPLANTATION SYSTEM

[75] Inventors: Larry F. Templeton; Roger B. Gault, both of Austin, Tex.

[73] Assignee: Accelerators, Inc., Austin, Tex.

[22] Filed: Feb. 11, 1975

[21] Appl. No.: 549,082

[52] U.S. Cl............................. 148/1.5; 250/492 A; 357/91
[51] Int. Cl.² ......................................... H01L 21/26
[58] Field of Search.................. 148/1.5; 250/492 A

[56] References Cited
UNITED STATES PATENTS

| | | | |
|---|---|---|---|
| 2,860,251 | 11/1958 | Pakswer et al................. | 250/492 A |
| 3,206,336 | 9/1965 | Hora..................... | 148/1.5 |
| 3,684,904 | 8/1972 | Galutva et al. ............. | 250/492 A X |
| 3,887,811 | 6/1975 | Livesay....................... | 250/492 A X |

*Primary Examiner*—L. Dewayne Rutledge
*Assistant Examiner*—J. M. Davis
*Attorney, Agent, or Firm*—Arnold, White & Durkee

[57] ABSTRACT

An Automatic End Station arrangement for use in conjunction with ion implantation apparatus to provide continuous implantation of semi-conductor wafers is disclosed. Wafers are indexed one by one out of a standard cartridge onto a conveyor track from which they are directed into the slot of a downwardly directed slotted passageway which has been defined between two appropriately sealed plate members. The wafer slides down the passageway until it is situated adjacent to a portion of the passageway in communication with an ion implantation apparatus. The wafer is stopped at that point and the passageway sealed above and below the wafer by inflating a pair of resilient tubes which extend through one of the plate members and across the opening of the passageway. An airtight chamber is thus formed from which the air may be evacuated for effective ion implantation. After the appropriate ion dosage has been directed into the wafer, the ion beam is stopped, the inflatable tubes collapsed and the wafer dropped out of the implantation chamber and indexed into another cartridge for transportation, storage or further processing. Intermediate stage evacuation chambers may be provided before and after the implantation chamber in order to prevent exposure of the implantation chamber to the atmosphere.

10 Claims, 6 Drawing Figures

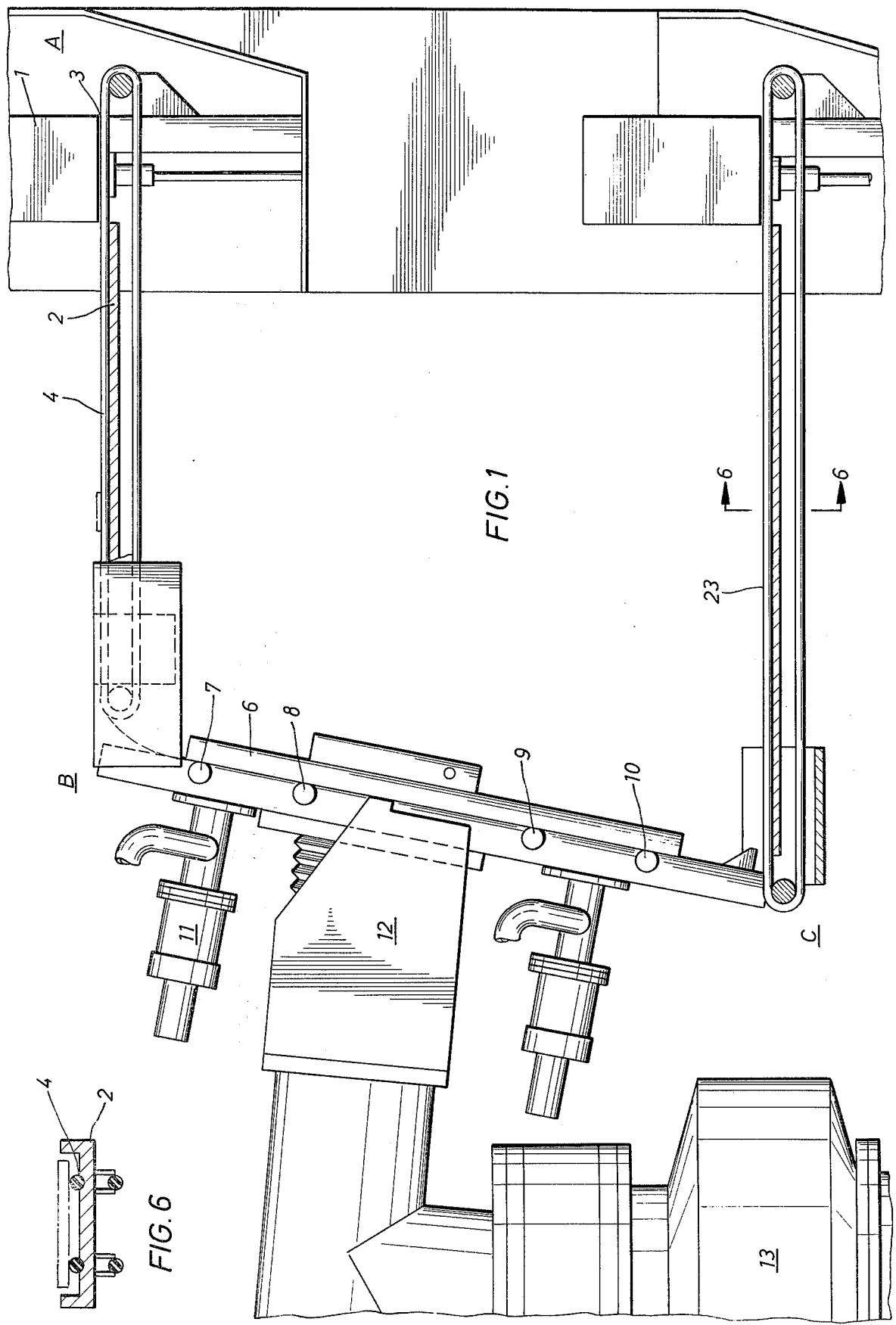

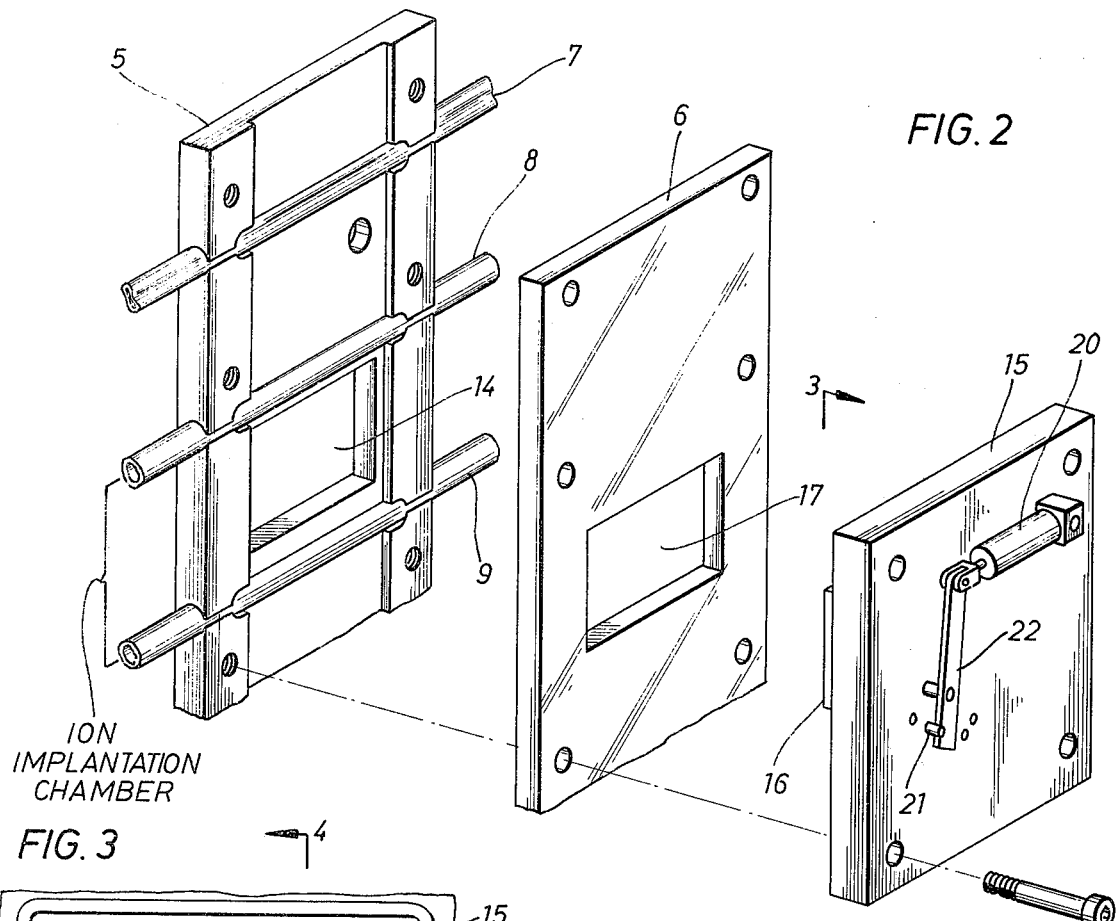
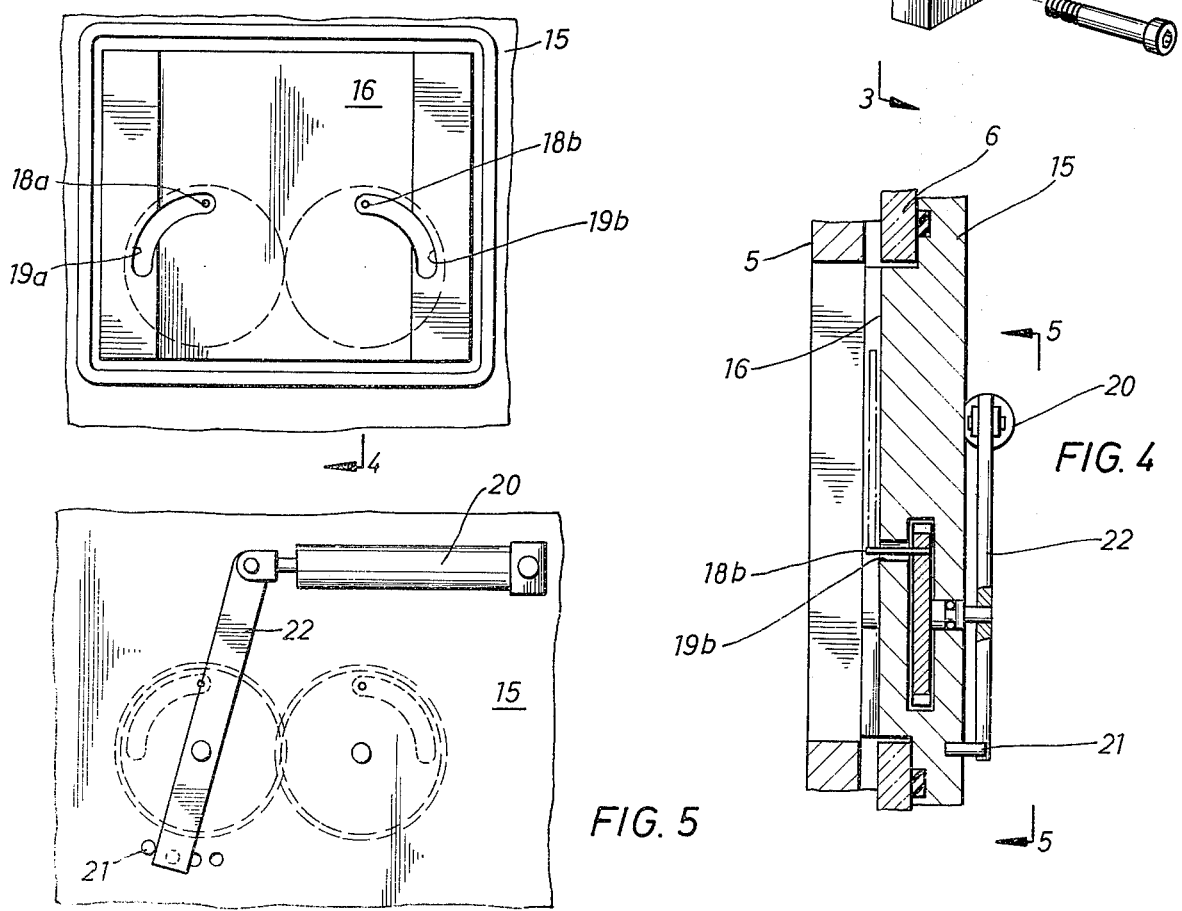

AUTOMATIC END STATION FOR ION IMPLANTATION SYSTEM

BACKGROUND OF THE INVENTION

This invention relates broadly to methods for manufacturing semi-conductor devices. More particularly, it relates to a continuous controlled differential atmosphere system to be employed in the fabrication of such devices. In particular, the invention relates to the implantation of impurity ions in the manufacture of solid state devices and micro circuits.

A most critical phase of the manufacture of semi-conductor devices and one which has been the subject of intensive investigation and development is the process of doping. In this procedure, the crystal structure of pre-designed areas or zones of the semi-conductor element is infused to a pre-determined level with "impurities", i.e., atoms of different chemical structure, in order to impart to that part of the semi-conductor element a particular desired conductivity. Thus, a semi-conductor substance such as N-type silicon may be doped with atoms of an acceptor impurity such as boron to convert a region in the silicon element from N to P-type conductivity. Conversely, P-type silicon may be doped with atoms such as phosphorus to convert a region to N-type conductivity.

Prior art techniques for doping include diffusion, evaporation, epitaxial growth and sputtering. More recently, techniques have been developed for bombarding the semi-conductor with a beam of impurity ions generated by a conventional high voltage accelerator. In this procedure the ions, which have been accelerated to a high velocity, penetrate the surface of the semi-conductor material and thus may be said to be "implanted" in the semi-conductor. Under controlled conditions the implated ions can be made to assume lattice positions within the semi-conductor, thus enabling them to act as donors or acceptors.

Unlike other techniques, ion bombardment is not primarily thermally activated. Thus reactions with the semi-conductor surface and/or masking materials, alteration of junction profiles within the semi-conductor and uneven distribution of the doping impurity within the doped area, all of which are inherent byproducts of other doping techniques, may be avoided to a large extent by the use of ion bombardment. In theory then, significant advantages over the more traditional junction formation techniques are available with ion implantation.

A significant deterrent, however, to the utilization of ion implantation doping techniques in large scale semi-conductor manufacturing has been the inability to reduce processing time and lower processing costs, particularly by automation. The prime factor here is the requirement that the ion bombarding technique be carried out in a vacuum. An example of a present day commercial technique involves placing a batch of semi-conductor elements in a large chamber, evacuating the chamber and employing mechanical, robot-like arms to pick up the semi-conductor elements individually, place them in appropriate position for the ion beam and remove them at the appropriate time. When the complete batch is implanted, the vacuum must be broken to remove the implanted wafers and insert a new batch. Quite naturally, the larger the vacuum chamber the more difficult and expensive it is to attain and maintain appropriate evacuated conditions in repeated fashion. This procedure is thus not only bulky and cumbersome but also is accompanied by substantial cost and lower reliability. Up to the time of the present invention, the requirement that implantation be carried out in an evacuated chamber appeared to be a major obstacle in the development of a reasonable cost, automatic ion implantation procedure.

BRIEF SUMMARY OF THE INVENTION

The present invention provides a method and apparatus for carrying out the automatic continuous ion implantation of semi-conductor wafers through the use of a continuous vacuum control system. According to the invention means must be provided for separating the substrates or wafers to be treated and indexing them one by one in sequence into a generally slot-shaped passageway or chute suitable for passage of only a single substrate thickness, which has been defined in a processing body, typically formed by sealing together two flat plates. At a suitable location midway between the end points of said passageway, means are positioned appropriately adjacent to and communicating with an ion beam source to stop and hold the wafer in position relative to said ion beam source for receiving the ion beam. At least one pair of resilient, inflatable tubes extends through one of the sealed plates defining the passageway, one of said tubes being located appropriately above and another below the wafer implantation position. Each of the tubes extends laterally across the passageway and when inflated totally fills the passageway aperture. Thus, when a pair of tubes is inflated, they seal the passageway against the atmosphere, defining an air-tight implantation chamber.

The thus sealed chamber is evacuated by pumping air out through appropriately supplied exhaust ports in one of the seal plates and the semi-conductor wafer is thereafter bombarded with the ion beam for a time period suitable for providing the desired degree of ion implantation. The resilient tube sealing the passageway opening below the wafer is then deflated and the wafer permitted to exit from the ion implantation chamber.

When the wafer moves out of position, the deflated resilient tube at the exit of the ion implantation chamber reinflates and the tube sealing the entrance is deflated whereby another wafer is indexed into position within the vacuum chamber. A system of continuous forming and reforming a series of one or more controlled vacuum chambers is thus provided wherein a dynamic operation is achieved, the time for evacuating and repressurizing the vacuum chamber is minimized and the productivity of an ion implantation procedure is substantially increased.

From the foregoing, it is apparent that one of the main features of this invention is the provision of a continuous system of controlled differential atmosphere processing chambers for the processing of substrates or wafers in a highly efficient manner, with provisions optionally made, if desired, for automatic loading, additional processing and unloading.

A further feature of the invention is that of providing a controlled differential atmosphere system for treating substrates or wafers wherein the desired differential atmospheric characteristic, such as vacuum pressure, can be accurately controlled in different processing regions on a continuous basis and the overall system size and space requirements substantially reduced.

The foregoing and other features and advantages of the invention will be apparent from the following more particular description of the preferred embodiment of the invention, as illustrated in the accompanying drawings.

DESCRIPTION OF THE DRAWINGS

FIG. 1 is a side view of the preferred end station assembly arrangement according to the present invention. It will be apparent that certain support structure, electrical wiring and air connections have been cut away or omitted to simplify understanding of the assembly.

FIG. 2 is an exploded perspective detail illustrating pertinent portions of the various components making up the ion implantation chamber of the preferred arrangement of the invention.

FIG. 3 is a front view of the wafer positioning means assembly shown in FIG. 2, illustrating more fully the wafer positioning pins in their adjustment slots.

FIG. 4 is a sectional elevation taken on the line 4 — 4 of FIG. 3, additionally showing (also in section) the assembled wafer positioning means, with a wafer in position, in the assembled vacuum chamber.

FIG. 5 is an elevational back view showing in more detail the mechanism by which the wafer positioning pins are adjusted in the assembly of FIGS. 3 and 4.

FIG. 6 is an elevation cross section of the preferred transport mechanism, employing a pair of O-ring conveyor belts. A wafer is shown in position on the two conveyor tracks.

DETAILED DESCRIPTION OF THE INVENTION

In a preferred arrangement according to the invention, a plurality of silicon wafers are fed into a suitable cartridge, or container, wherein they are held in position one separated from the other. As will be understood, the wafers have been previously processed in preparation for a desired end use and are ready to be ion implanted. Each wafer may or may not have been previously doped. In some cases it will be appropriate to provide a suitable mask over the wafer surface so that only pre-selected regions on the wafer surface are implanted.

The cartridge containing the wafers is then placed into or delivered to a feeding mechanism comprising an indexing platform positioned over a suitable moving transport means, such as a pair of conveyor tracks. The indexing platform is supported by a piston or movable pedestal which projects up between the tracks of the transport means. As will be understood, the surfaces of the wafers must be kept free from contamination and scratches. For this reason, air conveyors or conveying materials having a non-abrasive surface should be employed. It is preferable to utilize a pair of driven belts having a circular cross section and made from soft material such as rubber to form the tracks of the transport conveyor. Alternatively, a series of small pulley driven belts or "fingers" formed by rubber O-rings around small shieves can be utilized for the transport surface. Each of these procedures will provide a non-abrasive, minimum contact transport mechanism.

At a suitable, predetermined point in time, the piston or pedestal is lowered such that the bottom-most wafer in the storage cartridge, drops below the transport surface to be picked up by the conveyor tracks and moved out of the cartridge onto the transport surface. The wafers are thus separated and conveyed by the transport means to a point where they are indexed one by one off the transport means and directed into a generally slot-shaped passageway.

Where it is contemplated to implant only a single wafer at a time, the passageway is conveniently of a size adequate for not more than one wafer to pass through. It will be apparent, however, to those in this art that the concept of this invention may be readily adapted to provide for simultaneous implantation of multiple wafers, the only requirement being that the slot be sized for only a single wafer thickness. The passageway should be positioned to extend in a substantially downward direction such that when a wafer passes from the indexing means down through the passageway it does not bind. In the preferred embodiment of the invention, the slotted passageway is formed by sealing together two plate members, a portion of the surface of one such member having been milled away or otherwise removed to define three sides of the slot.

The position of each wafer as it lands on the transport mechanism should be such that the surface to be implanted is exposed. Indexing into the slotted passageway is carried out such that when the wafer moves off the transport belts into the slot the surface to be implanted is made to face in the appropriate position depending upon the location of the ion implantation apparatus. We have found that a convenient position for the slotted passageway is at an angle somewhat less than 90° from the plane of the transport mechanism belts. Thus the wafers in effect slide down one surface of the slotted passageway aided only by gravity.

Intermediately spaced along the length of the slotted passageway are a series of one or more single wafer processing chambers, each of which is set off between a pair of resilient inflatable tubes extending through one of the sealing plates and across the opening of the passageway. Each of the tubes is positioned within a recess in the passageway wall such that when the tube is deflated and in a somewhat collapsed condition, a wafer may pass freely by the tube without being stopped. When the tubes are fully inflated, they totally fill the passageway, blocking off the flow of wafers and sealing the passageway against atmospheric changes. When two such tubes are thus inflated, a sealed processing chamber is formed within the passageway.

In the preferred apparatus, at a suitable point about midway along the length of the passageway, there is provided an opening, or "window" in the body of one plate member thus effecting communication of the passageway with an ion beam source. One inflatable tube is positioned at a point above and another at a point below this window such that a single wafer will fit between them in a position directly adjacent the window and the ion beam source. When these two tubes are inflated the chamber thus formed is sealed effectively against pressure change. When the high vacuum pumps typically associated with ion implantation apparatus are turned on, the gases in the chamber are exhausted and an ion implantation chamber is effectively formed.

In the preferred ion implantation apparatus there are two additional inflatable tubes, thus providing for the formation of an intermediate or "roughing" chamber situated above and one below the actual ion implantation chamber. These chambers permit retention to some degree of the vacuum within the ion implantation chamber when a wafer is indexed in or out of that chamber. By this means, the high vacuum apparatus need only pump out a smaller amount of air to effect the appropriate pressure reduction and thus a more efficient, reliable performance is obtained in continuous operation.

According to the intended procedure, therefore, a wafer is indexed into the first, or "entrance" roughing chamber and the air is pumped out of that chamber to a pressure of about $10^{-2}$ to $10^{-3}$ torr. Thereafter, the lower of the tubes forming the entrance roughing chamber is deflated, permitting the wafer to drop into the implantation chamber, which has been maintained at or near the desired vacuum. When the wafer drops into position in the implantation chamber, the same tube (which, of course, serves also as the "top" of the implantation chamber) is re-inflated, thereby re-sealing the implantation chamber. That chamber is then evacuated to the implantation pressure which typically will be between about $5 \times 10^{-5}$ to $2 \times 10^{-7}$ torr.

Implantation thereafter is carried out by beaming the appropriate quantum and type of ions for the appropriate time onto the surface of the wafer according to state of the art procedures. Typically, the entire procedure will take about 10 seconds. Thereafter, the bottom tube in the implantation chamber is deflated, permitting the wafer to drop into the exit roughing chamber. When this tube is re-inflated, the implantation chamber is re-sealed and ready to receive the next wafer. The implanted wafer is indexed out of the slotted passageway by deflating the last of the resilient tubes. From this point, the wafer may be directed onto another transport belt similar to that which indexed it into the implantation sequence from which it can be fed into a waiting wafer container or it may be conducted to another location for any further processing which might be necessary.

The key to the successful dynamic sealing and resealing of the processing chambers in the slotted passageway is the inflatable resilient tube. As indicated above, the tubes must be so resilient that in their deflated state they do not block the smooth passage of a wafer through the passageway, yet in their inflated state they must completely fill the passageway and seal it against any significant loss of pressure differential. The resilient material preferred for the walls of the inflatable tubes is natural rubber of the so-called "surgical" grade, although any material of similar characteristics may be employed. Natural rubber has the characteristic of being highly resilient and inflatable yet strong enough to resist the significant pressure differentials required in this procedure. It is also flexible enough so that when deflated, it collapses somewhat. More importantly, however, it retains these characteristics for extended periods. The dynamic airtight seal effected by the inflation and deflation of a natural rubber surgical tube has the capability of lasting hundreds of thousands of cycles when employed in the present invention. This permits a dynamic vacuum seal characteristic which is unheard of with respect to conventional vacuum apparatus.

While it has been stated that the preferred arrangement is to have both entrance and exit roughing chambers, it will be appreciated that the process of the invention is capable of being carried out with only a single vacuum chamber, effected by means of a single pair of inflatable tubes. In such an arrangement, the pumping demand placed upon the high vacuum pump of the ion implanter is greatly increased, but this has not been demonstrated to have serious limitations on the process.

A typical semi-conductor wafer to be treated according to the present invention is about 0.010 to 0.020 inches in thickness and has a square or circular shaped top and bottom surface having a diameter of from about 2 to 4 inches. It has become a standard practice in the industry to store and transport these wafers in prefabricated and reusable slotted cartridges designed to contain a plurality of wafers (most commonly 25), each in its separate slot or compartment. In the preferred arrangement for an automatic end station according to the present invention, wafers are automatically and continuously taken from one such cartridge, implanted, and fed into another cartridge for further processing, storage or transportation without any intermediate handling of the wafers or cartridges. There is also no requirement that the cartridge itself be introduced into a vacuum chamber.

The preferred system is illustrated in FIG. 1 of the accompanying drawings. For illustrative purposes this drawing does not show details of such incidental elements of the system as support structure and electrical and air lines and connections. However, these details are not considered to be part of the invention but rather to be well within the skill of the art. With reference to FIG. 1, there is shown at point "A", a cartridge 1, full of wafers and in position straddling transport track 2 on indexing platform 3. Platform 3 is moved downwardly a single fixed distance to positively release a single wafer onto transport track 2. Indexing is actuated by a signal from appropriate control logic (not shown) indicating that the vacuum chamber is ready to accept another wafer. Having been deposited on the track, the wafer is carried by two parallel pulley-driven rubber belts 4 (see FIG. 6) to a position at point B where it is suitably tilted and directed into the slotted passageway within valve body 5.

It is preferred that once the wafer enters the slotted passageway it move freely but without altering the plane within which it is moving. For this reason, it is recommended that the valve body 5 be angled slightly in the direction away from the vertical such that the wafer does not fall freely but rather slides down the slotted passageway with its back against sealing plate 6. Plate 6 is preferably machined from a transparent material such as acrylic plastic. This not only provides for a smooth surface against which the wafer will slide but also permits visual inspection of the slotted passageway and the passage of a wafer therethrough.

As the wafer proceeds down the passageway, it encounters a series of rubber tubes 7, 8, 9 and 10 which, when expanded, form the vacuum chambers through which the wafer must proceed for implantation. The tubes should be positioned within valve body 5 in such manner that when they are fully deflated a wafer will pass by without binding or rubbing against them.

When the system control logic calls for another wafer to be introduced into the slotted passageway, tube 7 is fully deflated and tube 8 is fully inflated. Thus, the wafer will slide freely past tube 7 until it is stopped by tube 8. At this time, the system control logic actuates a signal causing tube 7 to be inflated, thus sealing off the first vacuum chamber, which will be called, for explanatory purposes, the "entrance roughing chamber". After a suitable time delay, valve 11 opens and the roughing vacuum pump turns on, exhausting the atmosphere within the entrance roughing chamber to a predetermined pressure in the order of $10^{-2}$ to $10^{-3}$ torr. When the desired roughing vacuum is reached, Valve 11 closes and tube 8 is deflated, permitting the wafer to slide into the ion implantation vacuum chamber, which is the area of the slotted passageway set-off by tubes 8 and 9. This chamber within the slotted passageway is in communication with the ion beam tube of an implantation apparatus 12 mounted adjacent to the end station. It is preferred, therefore, that tubes 8 and 9 be normally in an inflated state and the high vacuum necessary for implantation maintained in the chamber.

FIG. 2 shows in greater detail the preferred construction of that portion of the invention apparatus comprising the ion implantation chamber which, as mentioned above, is determined by the closing off of the slotted passageway between rubber tubes 8 and 9. In that chamber, communication is made with high energy ion implantation apparatus 12 through window 14 in valve body 5. The ion implantation chamber as well as the implantation apparatus itself is maintained at a vacuum between about $5 \times 10^{-5}$ to $2 \times 10^{-7}$ torr by means of a high vacuum pump and trap 13 connected to the ion implantation apparatus. In the preferred embodiment of the invention, wafers are first caught and held in position during the ion bombardment through the action of a wafer positioning means the details of which are shown in FIGS. 3, 4 and 5.

With reference to FIGS. 2–5, the wafer positioning means can be seen to comprise a backing portion 15 and an insert portion 16. Backing portion 15 is designed to be placed against sealing plate 6 in such manner that insert portion 16 fits tightly through window 17 in sealing plate 6 into communication with the ion implantation chamber. Catch pins 18a and 18b extend out into the ion implantation chamber through slots 19a and 19b in insert portion 16. Pins 18a and 18b are retractable along a path tangential to the arc of slots 19a and 19b and in opposite directions away from the center line of the slotted passageway. This retraction of catch pins 18a and 18b is accomplished by means of two gears driven by a single shaft with conventional seals, in association with air cylinder 20 on the reverse side of backing portion 15 of the positioning means. A wafer size adjusting stop 21 in association with arm 22 determines the extent to which catch pins 18a and 18b retract. The position of stop 21 is adjustable to suit the varying sizes of wafers which may be processed through the apparatus.

Catch pins 18a and 18b are positioned to catch and stop the wafer as it proceeds into the ion implantation chamber from the entrance roughing chamber as detailed above. If desired, provision may be made to adjust the position of the wafer within the ion implantation chamber after it has been caught by said pins.

In addition to providing a retractable, positive action positioning means which can be adjusted and movable without having to break the vacuum seal, catch pins 18a and 18b also provide for a means by which the charge which builds up on the surface of the wafer during implantation may be drained off and measured. This permits the use of a non-metal, transparent sealing plate 6 with its inherent advantages of visual inspection of the operation of the apparatus.

As will be apparent to those skilled in this art, suitable electronic circuitry may be provided to measure the current flowing into the wafer during ion bombardment, therefore providing an accurate measurement of the extent of implantation. After the pre-determined proper dosage of impurity ions is determined by such measuring means, suitable logic may be provided to turn off the ion beam while at the same time actuating the mechanism which retracts the catch pins. The same signal may also be used to deflate tube 9, thus permitting the implanted wafer to proceed out of the implantation chamber into the exit roughing chamber (which is that portion of the slotted passageway set off by tubes 9 and 10). Prior to this time, of course, tube 9 has been inflated and the thus sealed-off chamber evacuated to the desired roughing atmosphere. When the wafer drops into the roughing chamber, a signal may be generated actuating the re-inflation of tube 9 and the repositioning of catch pins 18a and 18b. After the appropriate time delay, permitting tube 9 to expand, tube 10 is deflated and the wafer slides down to point C where it is directed out of the slotted passageway onto transport track 23. It then proceeds in manner opposite that at the beginning of the sequence to the appropriate cartridge slot in a waiting wafer storage cartridge or directly to the next stage of the manufacturing process.

The foregoing description of the invention has been directed to a particular preferred embodiment in accordance with the requirements of the Patent Statutes and for purposes of explanation and illustration. It will be apparent, however, to those skilled in this art that many modifications and changes in both apparatus and procedure may be made without departing from the scope and spirit of the invention. For example, the chute, or passageway, through which the wafers pass in various stages of processing may be formed within a molded body of synthetic resin rather than by sealing two flat plates together. Also, with appropriate changes in the associated transport, implantation, and control systems, governed only by the state of the art in such systems, a multi-slot passageway may be provided, enabling the simultaneous implantation of a number of wafers. It will be obvious further that the invention may be utilized, with suitable modifications within the state of the art, at other processing stages of integrated circuit and solid state component fabrication, such as masking or photoresist applications, wherein controlled differential atmospheres are required and wafers may be processed a single unit at a time. These, and other modifications of the invention will be apparent to those skilled in this art. It is the applicants' intention in the following claims to cover all such equivalent modifications and variations as fall within the true spirit and scope of the invention.

What is claimed is:

1. Automatic end station apparatus for carrying out the continuous ion implantation of semi-conductor wafers, comprising:

A body containing therein a generally slot-shaped, downwardly directed passageway;

said passageway being of a size adequate to receive a single wafer thickness and positioned in a generally downward direction so as to allow for the unobstructed passage therethrough of a wafer aided only by the force of gravity;

means for indexing wafers into said passageway in a determined time sequence;

A window in said passageway midway to the exit thereof communicating with a source of high velocity doping ions such that ions may be directed through said window at right angles to the direction of movement of wafers through said passageway;

Wafer positioning means within said passageway to stop and hold a wafer in position adjacent said window during ion implantation and to release the wafer when implantation is completed;

At least two collapsible inflatable tubes, each extending through said body and laterally across the aperture of said passageway such that when deflated the tubes do not obstruct the free passage of wafers through said passageway and when inflated they expand to close off and seal the passageway against loss of air pressure;

At least one of said tubes positioned above said window and at least one of said tubes positioned below said window such that when said tubes are fully inflated an airtight chamber is formed suitable for ion implantation of at least one wafer;

Means for individually inflating and deflating each of said tubes according to determined sequence;

Means for collecting each wafer after it has been suitably implanted and has passed out of said airtight implantation chamber and said passageway; and Sequence control means for controlling the indexing of wafers into and out of said passageway and into and out of said airtight implantation chamber in said passageway.

2. Apparatus as in claim 1 wherein:

Said wafer positioning means for stopping and holding the wafer in position adjacent said window comprises a pair of retractable wire-like pins protruding from the surface of said slotted passageway opposite said ion implantation window, said pins being movable without breaking the airtight seal.

3. Apparatus as in claim 2, wherein:

Means are provided to drain off and measure the charge which builds up on the surface of a wafer during implantation, and the sequence control means is adapted to initiate the sequence control signal upon the measurement of a predetermined charge buildup on the surface of the wafer being implanted.

4. Apparatus as in claim 1, wherein:

Said slotted passageway is formed by sealing together two flat pieces one of which has had a portion of the surface thereof milled away defining three surfaces of said passageway such that when the other piece is positioned against it a slot is formed; and such other piece, which forms the back portion of said slotted passageway against the surface of which a wafer will slide as it passes downwardly through said passageway, is made from a smooth, transparent material.

5. Apparatus as in claim 4, wherein the smooth, transparent back portion is a plate molded from acrylic resin.

6. Apparatus as in claim 1 wherein said collapsible, inflatable tubes are made from natural rubber.

7. Apparatus for effecting the formation of a high vacuum pressure chamber suitable for the continuous ion implantation treatment of semiconductor wafers which comprises:

a body containing therein an essentially downwardly directed, generally slot-shaped passageway;

the dimensions of said passageway being suitable for the unobstructed passage therethrough of only a single wafer thickness;

an opening located in the wall of said passageway intermediate the ends of the passageway whereby communication is provided between said passageway and a source of high vacuum suitable for ion implantation;

said opening being appropriately sized to constitute a window in said passageway through which a beam of ions may be directed at right angles to the surface of a wafer suitably positioned in said passageway adjacent to said window; and releasable pressure sealing means for sealing and resealing that portion of the passageway immediately surrounding said window against the loss of vacuum pressure when a beam of ions is being directed through said window at the surface of a wafer positioned adjacent to said window, and for releasing said pressure when ion implantation is completed;

said releasable pressure sealing means comprising a pair of inflatable resilient tubes, each extending through said body and laterally across the aperture of said passageway, one of said tubes being positioned above said window and the other below said window;

such that when the tubes are in a deflated state they do not obstruct the passage of a wafer through said passageway, and when they are inflated said passageway is closed off and sealed to form an airtight chamber capable of maintaining vacuum pressures suitable for ion implantation.

8. Apparatus as in claim 7 wherein slotted passageway is molded directly into a body formed of synthetic resin.

9. Apparatus as in claim 7 wherein:

Said slotted passageway is formed by sealing together two flat pieces one of which has had a portion of the surface thereof milled away defining three surfaces of said passageway such that when the other piece is positioned against it a slot is formed.

10. In an automatic continuous system of implanting impurities in semi-conductor wafers by bombarding the wafers with selected ions, the improvement which comprises:

Separately passing each wafer to be bombarded through a slot-shaped passageway which contains at a point intermediate the ends thereof an opening communicating with a source of high velocity ions;

stopping and holding each semi-conductor wafer in said passageway adjacent to said opening and in a position to receive ions from said high velocity ion source;

sealing the passageway at a point above and one below said wafer to be implanted by inflating a pair of resilient tubes extending across said passageway at said points, which tubes totally fill and seal the opening in said passageway when inflated;

evacuating the sealed implantation chamber thus formed;

bombarding the semi-conductor wafer in said chamber with an ion beam for the appropriate time; and thereafter indexing the implanted wafer out of the implantation chamber by deflating the resilient tube below the wafer in the passageway; and indexing a new wafer into the implantation chamber by first re-inflating the lower resilient tube and subsequently deflating the upper resilient tube to permit a new wafer to proceed into place within said chamber; and repeating the above sequence.

* * * * *